(12) United States Patent
Ingvarsson et al.

(10) Patent No.: US 7,250,662 B2
(45) Date of Patent: Jul. 31, 2007

(54) MAGNETICALLY LINED CONDUCTORS

(75) Inventors: Snorri T. Ingvarsson, Reykjavik (IS); Rainer E. R. Leuschner, Mohegan Lake, NY (US); Yu Lu, Hopewell Junction, NY (US)

(73) Assignees: International Business Machines Corporation, Armonk, NY (US); Infineon Technologies North America Corporation, San Jose, CA (US)

( * ) Notice: Subject to any disclaimer, the term of this patent is extended or adjusted under 35 U.S.C. 154(b) by 97 days.

(21) Appl. No.: 10/632,365

(22) Filed: Jul. 31, 2003

(65) Prior Publication Data

US 2005/0026308 A1 Feb. 3, 2005

(51) Int. Cl.
*H01L 29/82* (2006.01)

(52) U.S. Cl. ............................ 257/422; 257/421

(58) Field of Classification Search ............. 257/422, 257/421
See application file for complete search history.

(56) References Cited

U.S. PATENT DOCUMENTS

| 5,956,267 | A | * | 9/1999 | Hurst et al. | ............ | 365/158 |
| 2004/0023065 | A1 | * | 2/2004 | Daughton et al. | ............ | 428/693 |

* cited by examiner

*Primary Examiner*—Douglas M. Menz
(74) *Attorney, Agent, or Firm*—Ference & Associates LLC

(57) ABSTRACT

A conductor with improved magnetic field per current ratio is disclosed. The conductor includes a magnetic liner lining a second surface and sides thereof. The magnetic liner is preferably a super-paramagnet with high susceptibility or a ferromagnet with a microstructure where the size of the non-exchanged coupled micro domains is so small that their energy content is close to or small compared to kT that such films have super-paramagnetic properties and essentially behave like a paramagnet with high susceptibility.

8 Claims, 7 Drawing Sheets

MAGNETICALLY LINED CONDUCTORS

FIELD OF THE INVENTION

This invention relates generally to integrated circuits (ICs). More particularly, the invention relates to improved magnetic random access memory ICs.

BACKGROUND OF THE INVENTION

Ferromagnetic elements are used, for example, to form non-volatile memory cells. A magnetic element typically includes bottom and top magnetic layers separated by a non-magnetic layer. The non-magnetic layer, for example, comprises an insulating material to form a magnetic tunnel junction (MTJ) type element. First and second conductors are magnetically coupled to the top and bottom magnetic layers to form a magnetic memory cell. One conductor is referred to as the bitline and the other is referred to as the wordline. The bitline and wordline are orthogonal to each other. A plurality of magnetic elements are interconnected by wordlines and bitlines to form an array.

The magnetic layers of an element are formed with magnetic vectors along an easy axis. The magnetic vector of one layer is fixed in a first direction along the easy axis (e.g., reference or fixed layer) and the magnetic vector of the other layer can be switched between first and second opposite directions along the easy axis (e.g., storage layer). As such, the magnetic vectors in the layers can be oriented parallel or antiparallel to each other. The top magnetic layer with switchable magnetic vector is referred to as the storage or free layer. The free layer might consist of two or more sub-layers that are coupled magnetically.

The direction of the vector in the storage layer can be switched by the application of a magnetic field generated by passing a current through one or both conductors. Depending on the magnetic field generated, the magnetic vector in the second layer either switches direction or remains the same. The magnetic element would have a first or second resistance value based on whether the magnetic vectors are oriented parallel or anti-parallel, representing a first or a second logic state being stored. For example, the magnetic element will have a high resistance value when the vectors of the layer are antiparallel to represent a logic 1 or a low resistance when the vectors are parallel to represent a logic 0. The states stored in the element can be read by passing a sense current through the element and sensing the difference between the resistances.

The magnitude of the magnetic field used to switch the magnetic vector is proportional to the magnitude of the current through the conductor. To reduce power consumption, it is desirable to increase the field per current ratio of the conductor. One conventional technique of increasing the field per current ratio is to provide a magnetic liner for conductors. Magnetic liners for conductors are described in, for example, Naji et al., "A low power 1 Mbit MRAM based on 1T1MTJ bit cell integrated with Copper Interconnects," VLSI Conf. (2002)", and M. Durlam, P. Naji et al., "A low power 1 Mbit MRAM based on 1T1MTJ bit cell integrated with Copper Interconnects," VLSI conference (2002).

U-shaped field keepers or ferromagnetic liners are known to increase the current induced magnetic switching field applied to magnetic elements sitting on top of a metal line containing such a ferromagnetic liner. Power consumption and chip size may thus be reduced as less current is needed to generate a given switching field; switches can thus be made smaller. Since for small magnetic elements (~100 nm) it is expected that the switching fields will go up the switches will consume a significant amount of the chip area.

Ferromagnetic liners are typically made by wrapping a U-shaped (or up-side down U-shaped for the line above the TJ) ferromagnetic material around the metal line. The magnetization of the ferromagnetic liner material is along the long axis of the metal line, thus creating poles on both ends. It has been shown that at such poles the fringing field is of the order of 50 to 300 Gauss. The magnetic cells should thus be some distance from the line ends in order not to shift the switching point of the cells. A safe distance of about several micrometers can be calculated such a distance results in significant limitations of the chip layout since the arrays in memory chips should be packed as densely as possible.

Depending on current direction, ferromagnetic liners may also show a hysteresis effect. The fields for switching of the ferromagnetic liner magnetization direction are normally much higher than the fields for magnetic elements. There can be domain effects in a ferromagnetic liner, however, which allow a partially local switching of the ferromagnetic liner when a current is passed through the line. This partial switching broadens the switching field distribution for the magnetic elements and therefore significantly reduces the write margin.

The fringing fields and hystereses effects associated with a ferromagnetic liner thus limit the use of the ferromagnetic liner in a memory chip having tight element spacing and thousands of elements in a sub-array.

SUMMARY OF THE INVENTION

In accordance with at least one presently preferred embodiment of the present invention, there is broadly contemplated a memory chip with tight element spacing.

In summary, one aspect of the present invention provides an integrated circuit comprising: a conductor for generating a magnetic field, the conductor having first and second surfaces and sides; a magnetic liner lining at least the sides and second surface of the conductor; and the magnetic liner having super-paramagnetic properties.

A further aspect of the invention provides a method of fabricating an integrated circuit, the method comprising the steps of: forming a conductor having first and second surfaces and sides; and lining the second surface and sides with a magnetic liner having super-paramagnetic properties.

Furthermore, an additional aspect of the present invention provides a integrated circuit including an array of magnetic memory cells, wherein a memory cell comprises: a magnetic element; a first conductor located above the magnetic element and in magnetic communication thereto, the first conductor having first and second surfaces and sides, the first side of the first conductor being adjacent to the magnetic element; a second conductor located below the magnetic element in magnetic communication thereto, the second conductor having first and second surfaces and sides, the first side of the second conductor being adjacent to the magnetic element; and a magnetic liner having super-paramagnetic properties lining the second surface and sides of at least one of the first and second conductors.

For a better understanding of the present invention, together with other and further features and advantages thereof, reference is made to the following description, taken in conjunction with the accompanying drawings, in which like reference numerals are used to identify the same or similar parts in several views, and the scope of the invention will be pointed out in the appended claims.

DESCRIPTION OF THE PREFERRED EMBODIMENTS

Figure 1:
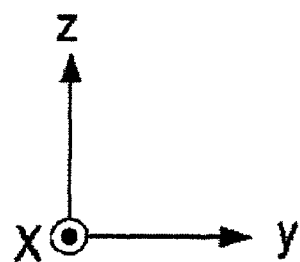
FIG. 1 shows magnetic element.
Figure 1:
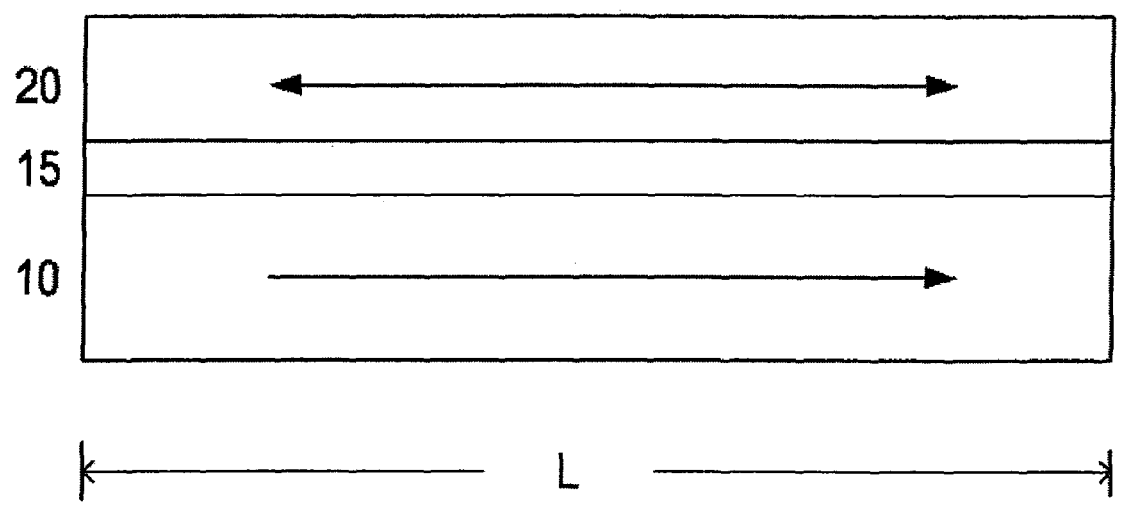

FIG. 1 shows a magnetic element. For purposes of discussion, the z-axis is in the vertical direction with the positive z-direction toward the top, y-axis is in the horizontal direction with the positive y-direction toward the right, and the x-axis perpendicular to both the z and y-axes with the positive x direction coming out of the drawing. The magnetic element comprises first and second magnetic layers 10 and 20. The first and second magnetic layers need not be formed of the same materials. The first and second magnetic layers are separated by a non-magnetic layer 15. Separating the magnetic layers with an insulating layer creates a magnetic tunnel junction (MTJ) type element. Forming other types of magnetic elements may also be useful. For example, the magnetic layers can be separated by a conductive layer to create a giant magnetoresistive (GMR) type magnetic element.

Figure 2A:
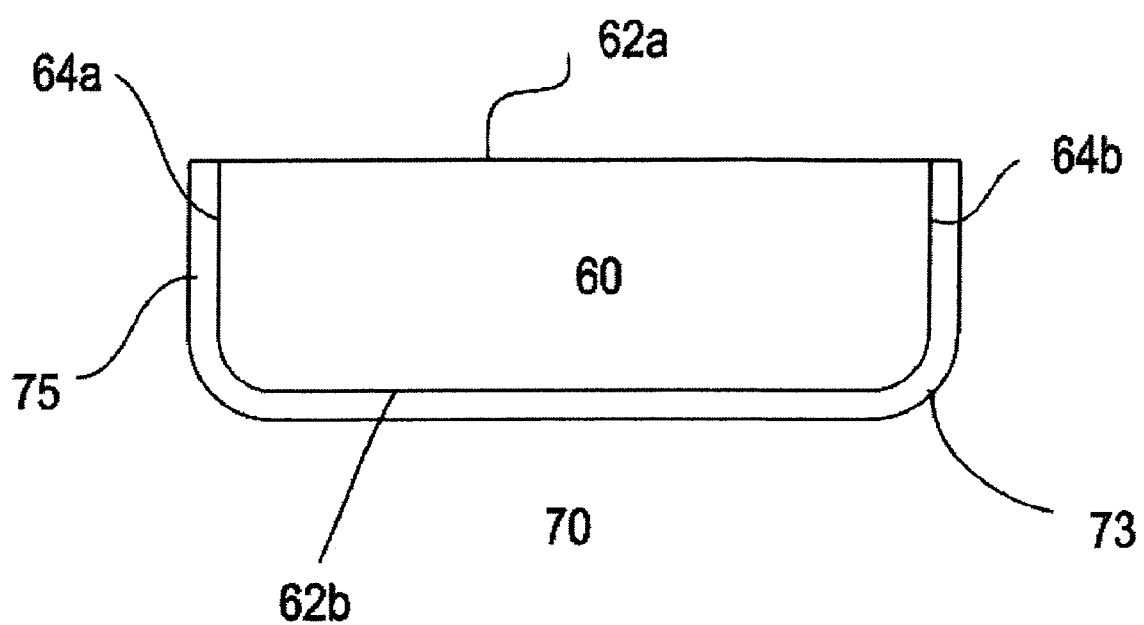
FIGS. 2a-2b show conductors in accordance with the invention.
Figure 2B:
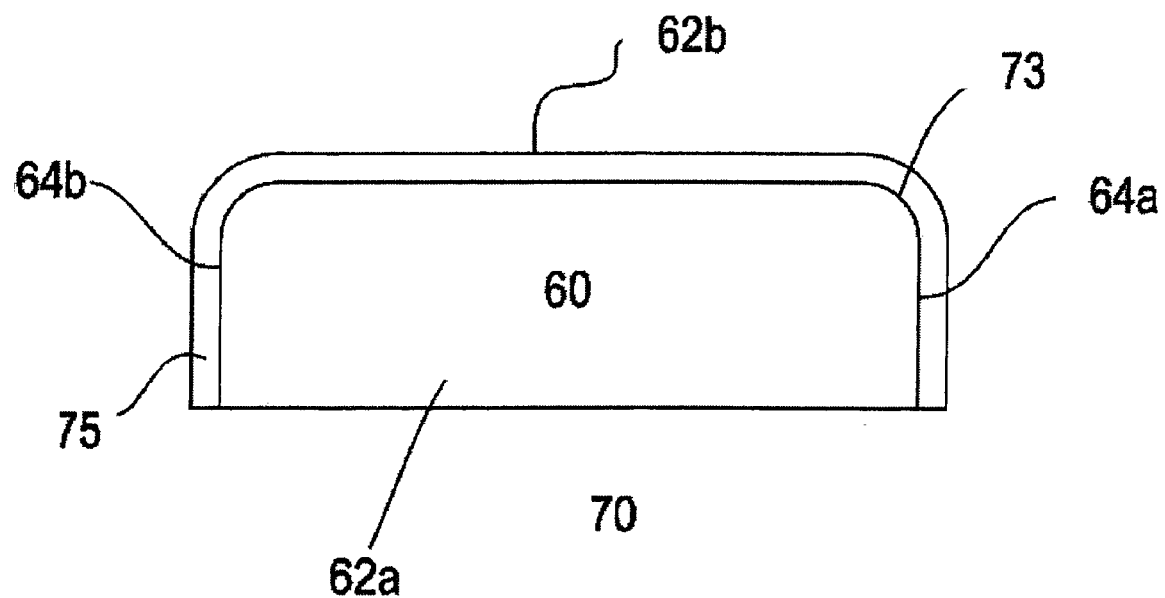

FIG. 2a shows a cross-sectional view of a conductor 70 in accordance with the present invention. The conductor increases the magnetic field per current ratio due to the presence of a magnetic liner. As shown, the conductor includes a conductive line 60. The conductive line comprises first and second surfaces 62a-b and sides 64a-b. A liner 75 lines the sides and one of the top or bottom surface of the conductor. The magnetic liner serves to concentrate the magnetic field to the surface of the conductor that is not covered with the magnetic liner. The unlined surface is adjacent to a magnetic element. If the magnetic element is switched by a magnetic field generated from a conductor located below the magnetic element, the first or unlined surface is the top surface of the conductive line. Alternatively, the first or unlined surface is the bottom surface if the magnetic field is generated by a conductor located above the magnetic element, as shown in FIG. 2b.

In accordance with the present invention, the magnetic liner 75 is preferably a super-paramagnet with high susceptibility, on the order of 5-100. By way of example, It should be noted that normal paramagnets (any metal that has a Curie temperature below the operating temperature, e.g., Gd) have very low susceptibilities and are not suitable for use in accordance with the present invention. Certain ferromagnets, however, may also be used as the liner 75 in accordance with the present invention. For example, there are ferromagnets with a non-exchanged coupled microstructure where the size of the micro domains is so small that their energy content is close to or small compared to kT (on the order of up to 5 times kT) that such films have super-paramagnetic properties and essentially behave like a paramagnet with high susceptibility. In this regard, it is known that k is the Boltzmann constant and T is the actual temperature; kT defines the energy content of the environment, that means any thermally activated process can happen when the environment can provide the energy. If the activation energy is close to equal to kT the environment can provide the energy. In accordance with the present invention the magnetic moments of the micro elements arrange each other in such a manner that they cancel each other out, i.e., act as a super-paramagnet. Without an external magnetic field induced by the current, local magnetic moments cancel each other out (super-paramagnetic effect); with an external magnetic field the local magnetic moments are aligned by the current induced field to give the desired field enhancement effect. Thus, when a super-paramagnetic material is used as liner 75, no hysteresis effects and no fringing fields occur.

It is presently preferred that the ferromagnetic films discussed in the preceding paragraph are made either from small ferromagnetic particles in a polymeric matrix, as a particle film, or from sputtered or evaporated metal films with at least two metals. The presently preferred ferromagnetic films are as follows:

Spin-on film made out of ferromagnetic particles, such as ~10 nm round NiFe particles (coated with adhesion promoter to make them compatible with the polymeric matrix), in a high thermal stability polymer, such as polyimide, polybenzoxazol, or SILK, a polyaromatic polymer obtained from DuPont in Wilmington, Del. It has been found that using such a spin-on film when the wafer is baked in an up-side-down mode inhibits the concentration of the polymer solution on the trench bottom;

Evaporated multilayer films made out of repeated layers (~30) of Terbium (1.2 nm) and ferromagnetic particles, such as iron (0.6 nm); and Deposition of ferromagnetic particles, such as iron nanoparticles, by an plasma enhanced chemical vapor deposition (CVD) process from a Fe(CO)5 precursor at <400 deg C. with a particle size of around 10 nm.

It should be understood these films are examples of those films which may be used; other ferromagnet precursors may be used too, for example, Ni or Co precursors. It should also be noted the making of such films is known to those in the art. See "Structural and magnetic characterization of Fe nanoparticles synthesized by chemical vapor condensation process," X. L. Dong, C. J. Choi and B. K. Kim JOURNAL OF APPLIED PHYSICS VOLUME 92, NUMBER 9 1 Nov. 2002. Is it presently preferred that the magnetic liner be approximately 30 nm in conformal thickness to achieve optimal results. The thickness of the magnetic liner is driven by the a compromise wherein the magnetic liner does not consume too much of the copper and an ineffectiveness (too little of the magnetic liner material would result in a saturation effect at relatively low fields. Thus, the thickness required of high magnetic moment materials would not as great as the thickness required for lower magnetic moment materials.

Figure 3:
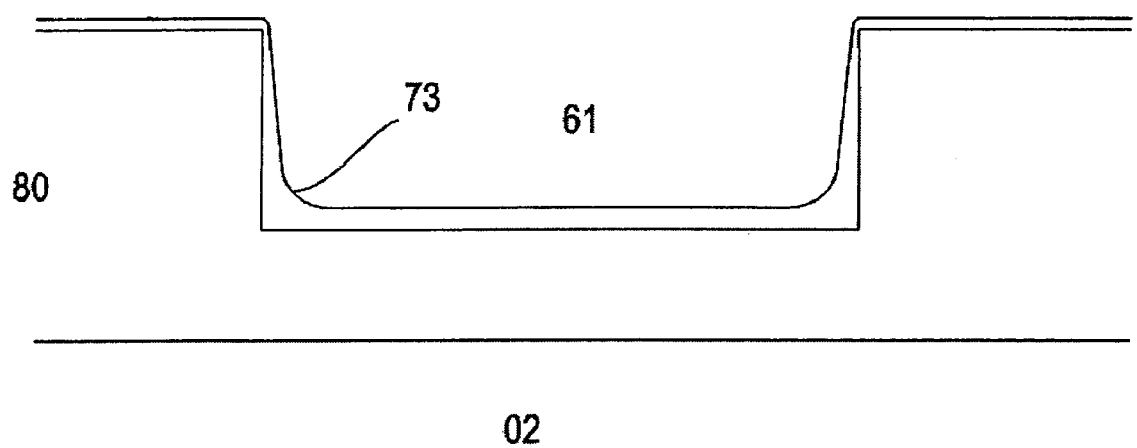
FIGS. 3-6 show a process for forming a conductor in accordance with the invention

FIGS. 3-6 show a process for forming a conductor in accordance with one embodiment of the invention. Referring to FIG. 3, a substrate 02 is provided. The substrate, for example, is prepared with support circuitry (not shown), for accessing the memory array. Additionally, other components that serve as part of an IC are also included. An interlevel dielectric layer (ILD) 80 is provided over the substrate surface, covering components already formed thereover. The ILD layer comprises, for example, silicon oxide. Other types of dielectric materials, such as doped silicate glass or silicon nitride, can also be used. The dielectric layer is prepared with a trench 61. The trench is formed by, for example, conventional mask and etch techniques. Such techniques include forming a resist mask and anisotropically etching (e.g., reactive ion etching or RIE) the dielectric layer. The surfaces of trench 61 are coated with a diffusion barrier 73 using conventional physical vapor or chemical vapor deposition techniques. The diffusion barrier serves to prevent the diffusion of magnetic liner material into the ILD material. The presently preferred composition of this diffusion barrier is Tantalum nitride/Tantalum (TaN/Ta), although other types of barrier materials may be used. It is presently preferred that the barrier is deposited using conventional physical vapor or chemical vapor deposition techniques. Prior to the application of the diffusion barrier, the shape of the trench may be varied to the magnetic characteristics, for example, as discussed in U.S. patent application Ser. No. 10/249,528, filed on Apr. 17, 2003, and entitled "Magnetically Lined Conductors".

Figure 4:
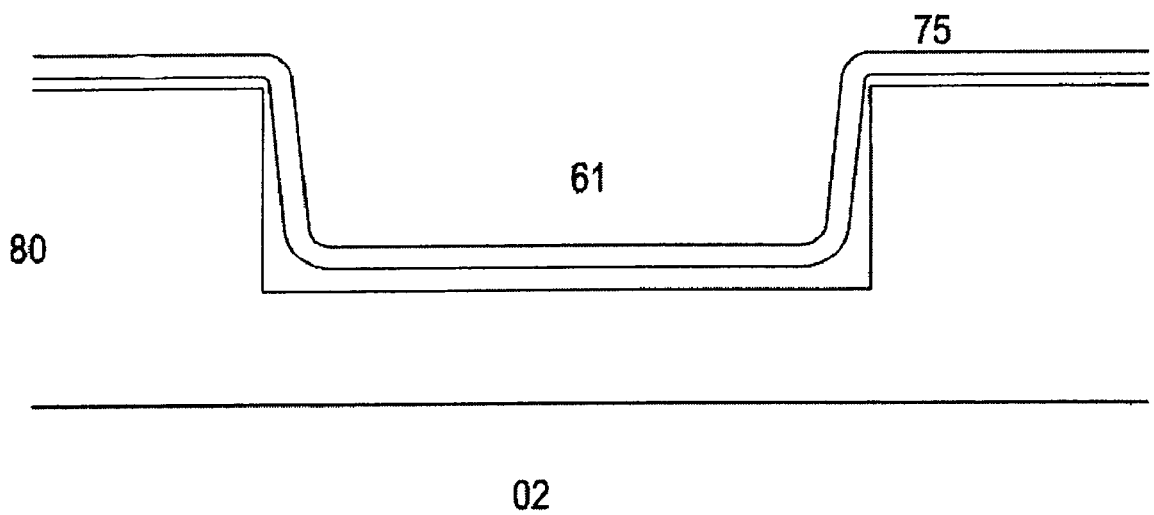

Referring now to FIG. 4, a magnetic liner 75 is then deposited, covering the substrate and lining the trench. It is presently preferred that the magnetic liner material is a super-paramagnet with high susceptibility or a ferromagnet with a microstructure where the size of the non-exchanged coupled micro domains is so small that it energy content is close to or small compared to kT. Non-exchanged micro domains are micro domains slightly separated from one another. By way of example, the slight separation may occur from either the polymer, the non-magnetic metal, oxides, or even air. As discussed above, such films have super-paramagnetic properties and essentially behave like a paramagnet with high susceptibility. The deposit of the magnetic liner is preferably accomplished in the manner appropriate for the magnetic material or film, which was previously discussed.

Figure 5:
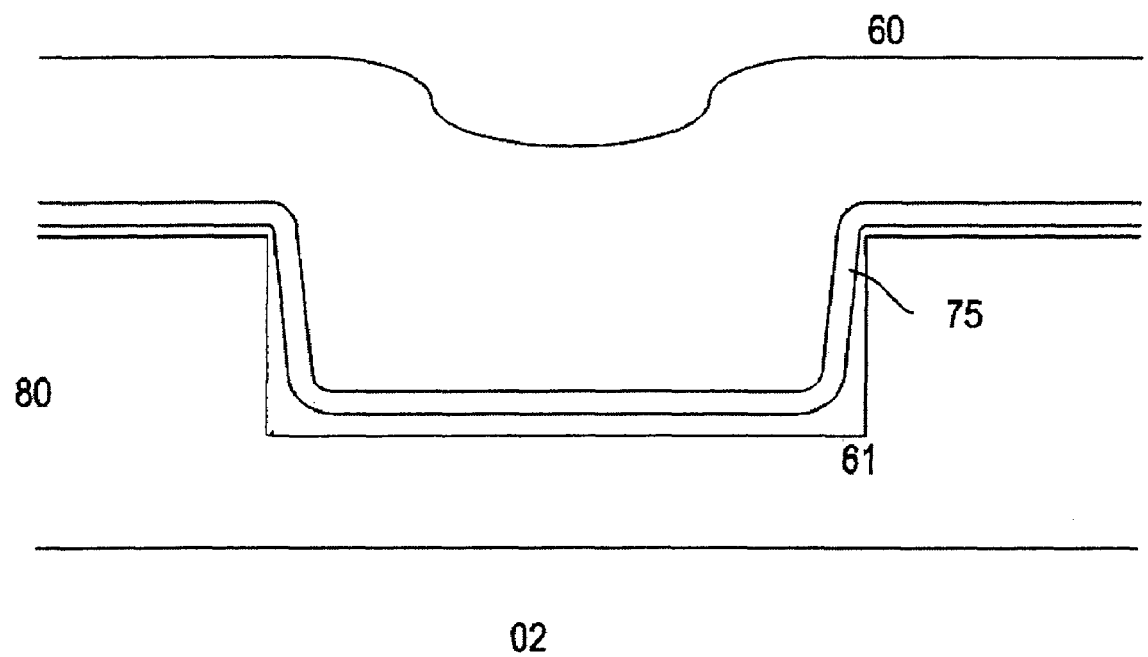

Referring now to FIG. 5, a conductive material 60 is deposited on the substrate, filing the trench. It is presently preferred that the conductive material be copper or copper alloy, although other conductive materials may be used. The conductive material is preferably applied by electroplating. When copper or copper alloy is used as the conductive material, it is presently preferred that prior to the deposit of the conductive material, a second diffusion barrier is applied to assist in preventing the diffusion of the conductive material into the liner or vice-versa. Again, the presently preferred barrier material is Tantalum nitride/Tantalum (TaN/Ta), although other types of barrier materials may be used, and the barrier material be applied through a physical vapor deposition (PVD) process. Furthermore, when copper or copper alloy is used as the conductive material, is presently preferred that a copper seed layer be deposited after the barrier material and prior to the deposit of the conductive material.

Figure 6:
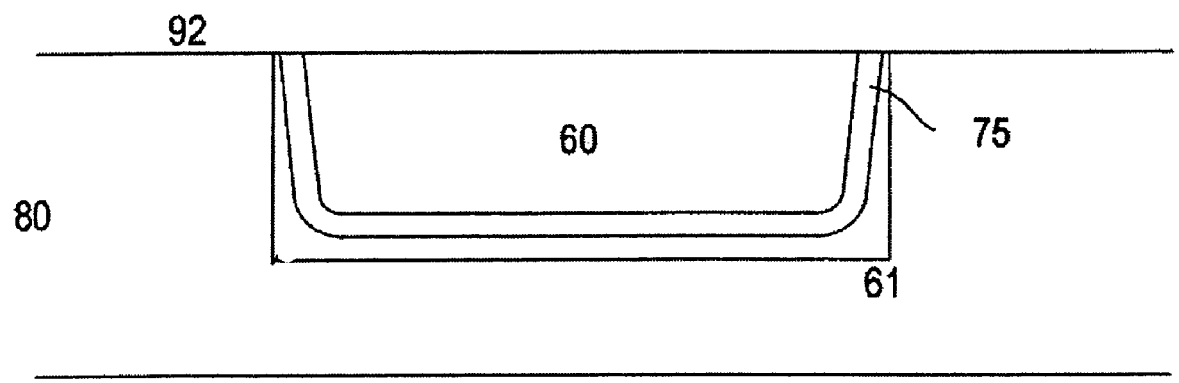

Referring now to FIG. 6, excess material above the substrate is preferably removed using the damascene technique. In this technique, grooves and holes are filled by deposition of metal followed by a complete removal of all metal covering the filled structures by chemical mechanical polishing (CMP). The technique is named after the way ornaments were once applied in damascene swords. Thereafter, the process continues to form a magnetic element such as the one described in FIG. 2a, above conductor 92. It should be understood the present invention may also be used in such a manner as to form a magnetic element such as the one described in FIG. 2b.

Although the invention has been described in the context of forming a single conductive line, it is understood that a plurality of conductive lines are present in an IC. The conductive lines serve, for example, bitlines and/or wordlines interconnecting a plurality of memory cells to form an array. The memory cells can be arranged in a cross-point architecture. Other types of architectures, such as FET architecture or diode architecture are also useful. Various magnetic memory architectures are described in, for example, Reohr et al., IEEE Circuits and Devices Magazine (Sep. 17, 2002); and Persoon et al., "Magnetic Random Access Memory and its prospects", JPL Publ. 01-15, pp177 (November 2001).

If not otherwise stated herein, it is to be assumed that all patents, patent applications, patent publications and other publications (including web-based publications) mentioned and cited herein are hereby fully incorporated by reference herein as if set forth in their entirety herein.

Although illustrative embodiments of the present invention have been described herein with reference to the accompanying drawings, it is to be understood that the invention is not limited to those precise embodiments, and that various other changes and modifications may be affected therein by one skilled in the art without departing from the scope or spirit of the invention.

What is claimed is:

1. An integrated circuit comprising:
    a conductor for generating a magnetic field, the conductor having first and second surfaces and sides; and
    a magnetic liner lining at least the sides and second surface of the conductor,
    wherein the magnetic liner has super-paramagnetic properties and comprises a ferromagnetic film selected from the group consisting essentially of:
        spin-on film made out of ferromagnetic particles in a high thermal stability polymer; and
        evaporated multilayer films made out of repeated layers of Terbium and ferromagnetic particles.

2. The integrated circuit of claim 1 wherein the liner comprises a super-paramagnet with high susceptibility.

3. The integrated circuit of claim 1, wherein the ferromagnetic film has a microstructure having non-exchanged coupled micro domains whose size is so small that their energy content is close to or small compared to kT, whereby such film has super-paramagnetic properties.

4. The integrated circuit of claim 1, wherein the liner further comprises a first diffusion barrier between an outer surface of the liner and a dielectric layer in which the conductor is disposed and a second diffusion barrier disposed between an inner surface of the liner and the conductive line.

5. The integrated circuit of claim 4, wherein the diffusion barriers are Tantalum nitride/Tantalum.

6. The integrated circuit of claim 1 wherein the first surface is adjacent to a magnetic element.

7. The integrated circuit of claim 6 wherein the first surface is either a top or bottom surface of the conductor.

8. The integrated circuit of claim 6 wherein the liner further comprises a first diffusion barrier between an outer surface of the liner and a dielectric layer in which the conductor is disposed and a second diffusion barrier disposed between an inner surface of the liner and the conductive line.

* * * * *